United States Patent
Hanafi et al.

(10) Patent No.: US 7,613,031 B2
(45) Date of Patent: Nov. 3, 2009

(54) SYSTEM, APPARATUS, AND METHOD TO INCREASE READ AND WRITE STABILITY OF SCALED SRAM MEMORY CELLS

(75) Inventors: Hussein I. Hanafi, Basking Ridge, NJ (US); Paul Farrar, Okatie, SC (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/856,624

(22) Filed: Sep. 17, 2007

(65) Prior Publication Data

US 2009/0073782 A1    Mar. 19, 2009

(51) Int. Cl.
G11C 11/00    (2006.01)
(52) U.S. Cl. .................... 365/154; 365/201; 365/230.06
(58) Field of Classification Search ................. 365/154, 365/201, 230.06, 156
See application file for complete search history.

(56) References Cited

U.S. PATENT DOCUMENTS

| | | | |
|---|---|---|---|
| 6,674,672 B2 | 1/2004 | Forbes et al. | |
| 6,912,151 B2 | 6/2005 | King | |
| 6,987,686 B2 | 1/2006 | Kim et al. | |
| 7,018,873 B2 | 3/2006 | Dennard et al. | |
| 7,089,515 B2 | 8/2006 | Hanafi et al. | |
| 7,190,209 B2 | 3/2007 | Kang et al. | |
| 7,209,395 B2 | 4/2007 | Hsu et al. | |
| 7,236,408 B2 | 6/2007 | Joshi | |
| 2005/0037582 A1 | 2/2005 | Dennard et al. | |
| 2006/0034132 A1 | 2/2006 | Jain | |
| 2006/0262628 A1 | 11/2006 | Nii et al. | |
| 2007/0025162 A1* | 2/2007 | Deng et al. | 365/189.09 |
| 2007/0076467 A1* | 4/2007 | Yamaoka et al. | 365/154 |

OTHER PUBLICATIONS

Marinissen et al., Challenges in Embedded Memory Design and Test, Proceedings of the Design, Automation and Test in Europe Conference and Exhibition, 2005.
Reddy et al., Impact of Negative Bias Temperature Instability on Digital Circuit Reliability, 40th Annual International Reliability Physics Symposium, Dallas, Texas, 2002, pp. 248-254.
Lee et al., Effect of pMOST Bias-Temperature Instability on Circuit Reliability Performance, IEEE, 2003, pp. 353-356.

(Continued)

Primary Examiner—Huan Hoang
(74) Attorney, Agent, or Firm—TraskBritt

(57) ABSTRACT

Circuits, systems, and methods are disclosed for SRAM memories. An SRAM includes memory cells wherein read stability and write stability can be modified by adjusting a well bias signal operably coupled to an N-well of the memory cell. The well bias signal is generated at VDD or at a bias offset from VDD for both the read and the write operations. The memory cells may be adjusted for operation by designing the memory device to be stable relative to local parameter variations with a well bias substantially equal to VDD. The memory cells are then tested for stable read operations and stable write operations. If the write operations are unstable or the read operations are unstable, the well bias is modified and the memory cells are tested again.

26 Claims, 6 Drawing Sheets

OTHER PUBLICATIONS

Mueller et al., 6-T Cell Circuit Dependent GOX SBD Model for Accurate Prediction of Observed VCCMIN Test Voltage Dependency, 42nd Annual International Reliability Physics Symposium, Phoenix, Arizona, 2004, pp. 426-429.

Reddy et al., Impact of Negative Bias Temperature Instability, on Product Parametric Drift, ITC International Test Conference, 2004, pp. 148-155.

Ramadurai et al., SRAM Operational Voltage Shifts in the Presence of Gate Oxide Defects in 90 NM SOI, 44th Annual International Reliability Physics Symposium, San Jose, 2006, pp. 270-273.

La Rosa et al, Impact of NBTI Induced Statistical Variation to SRAM Cell Stability, 44th Annual International Reliability Physics Symposium, San Jose, 2006, pp. 274-282.

Pilo et al., A 5.6ns Random Cycle 144 Mb DRAM with 1.4Gb/s/pin and DDR3-SRAM Interface, 2003 IEEE International Solid-State Circuits Conference.

Pilo et al., A 5.6-ns Random Cycle 144-Mb DRAM with 1.4 Gb/s/pin and DDR3-SRAM Interface, IEEE Journal of Solid-State Circuits, vol. 38, No. 11, Nov. 2003, pp. 1974-1980.

Pilo et al., An SRAM Design in 65 nm and 45 nm Technology Nodes Featuring Read and Write-Assist Circuits to Expand Operating Voltage, 2006 Symposium on VLSI Circuits Digest of Technical Papers.

Pilo et al., An SRAM Design in 65-nm Technology Node Featuring Read and Write-Assist Circuits to Expand Operating Voltage, IEEE Journal of Solid-State Circuits, vol. 42, No. 4, Apr. 2007, pp. 813-819.

\* cited by examiner

US 7,613,031 B2

SYSTEM, APPARATUS, AND METHOD TO INCREASE READ AND WRITE STABILITY OF SCALED SRAM MEMORY CELLS

FIELD OF THE INVENTION

Embodiments of the present invention relate to semiconductor devices and, more particularly, to Static Random Access Memories (SRAM).

BACKGROUND

SRAMs may be manufactured as individual semiconductor devices or as an integral part of many microprocessors, system on a chip devices, and other logic devices. In today's microprocessors, a very large amount of embedded SRAM is usually used as cache memory. As with most memories, the demand for larger amounts of memory on a single device continues to grow. However, as transistor gate lengths scale down to 65 nanometers, 45 nanometers, and even smaller, designing SRAM bit cells that are stable for all functional requirements across a product's lifetime has become increasingly difficult.

Process variations, doping fluctuations, Negative Bias Temperature Instability (NBTI), defects, gate oxide defects, operating temperature variations, operating voltage variation, and other phenomena including terrestrial and extraterrestrial radiation may manifest as changes to transistor threshold voltage (VT). Furthermore, minimum operating voltage (Vmin) of the SRAM memory cells may drift as a result of burn-in testing, subsequent operation, or combinations thereof. This change in Vmin may result in a degradation of SRAM memory cells stability over time. These issues make it increasingly difficult to design and fabricate an SRAM memory that is stable for different operational modes such as read operations and write operations.

In order to minimize the impact of these variations on device threshold and memory cell stability, memory designers have designed SRAM memory cells with Metal Oxide Semiconductor Field Effect Transistor (MOSFET) devices having channel lengths much longer than the minimum allowed by the technology. The longer channel length results in a smaller variation in VT across process, temperature, and product lifetime. Using longer channel lengths result in a more stable memory cell. However, the memory cell with longer channel lengths is larger than it needs to be based on the lithography requirements for any given process. Even a small change in the size of a memory cell can result in drastic increases to the overall SRAM, which in turn can drastically increase the size of a microprocessor or system on a chip device with embedded SRAM. Larger semiconductor device sizes generally translate into higher costs for the devices.

As a result, there is a need for a memory circuit design and method of making a memory circuit that results in a smaller memory cell that is stable across operational modes, process variations, ambient condition variations, and product lifecycles.

BRIEF DESCRIPTION OF THE DRAWINGS

In the drawings, which illustrate embodiments of the invention.

DETAILED DESCRIPTION

Figure 1:
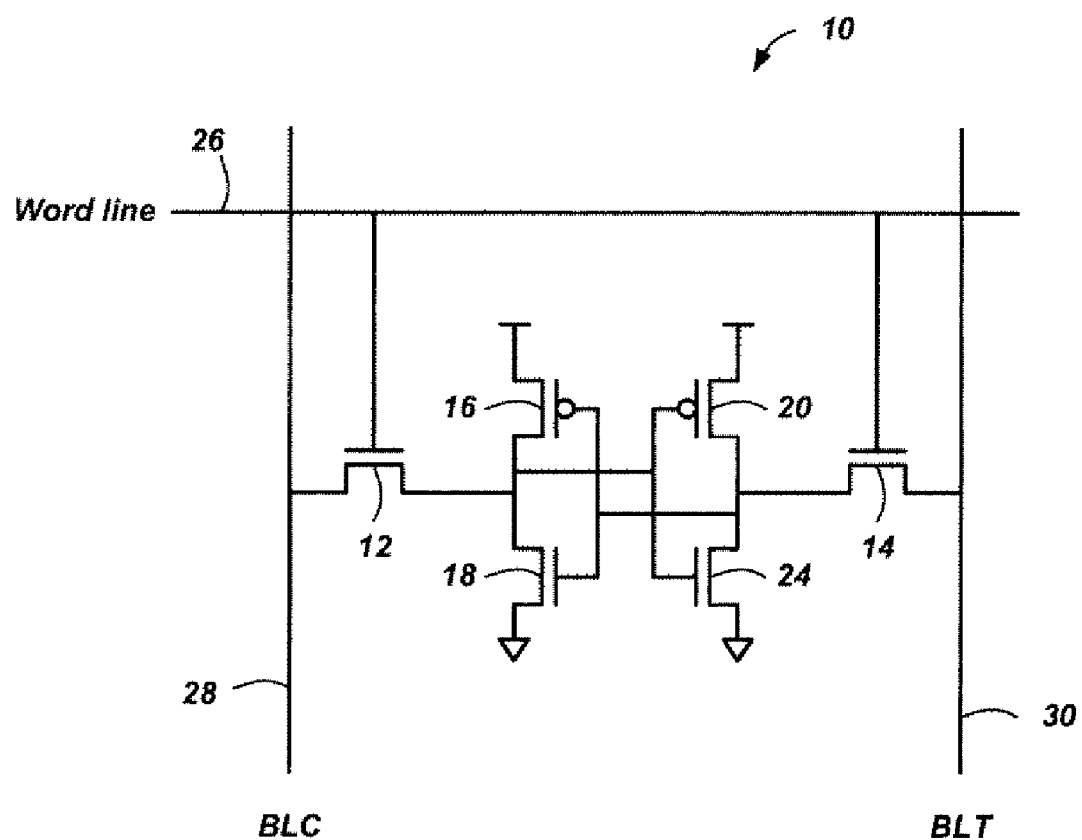
FIG. 1 is a schematic diagram of a conventional memory cell.

Embodiments disclosed herein include systems, apparatuses and methods for creating SRAM memory cells that can be smaller and remain stable across operational modes, process variations, ambient condition variations and product lifecycles.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and embodiments of the present invention may be implemented on any number of data signals including a single data signal.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

As mentioned above, for designers to maintain SRAM cell stability, across the product's lifetime, SRAM cells have been designed with MOSFET devices having channel lengths much longer than the minimum allowed by lithography limitations.

In addition, SRAM cells may have different optimal designs for different operational modes. For example, a designer would like to configure a 6 T memory cell with certain device sizes to optimize the ability to write to the memory cell. However, to read the memory cell, the designer would like to configure the 6 T memory cell with different device sizes that optimize the ability to read the memory cell without disturbing the value stored in the memory cell. As a result, the designer must often balance the device sizes to meet both reading constraints and writing constraints.

FIG. 1 illustrates a conventional memory cell 10. The memory cell 10 includes a pair of cross-coupled inverters. The first inverter includes p-channel transistor 16 coupled to VDD and n-channel transistor 18 coupled to ground (i.e., VSS). The second inverter includes p-channel transistor 20 coupled to VDD and n-channel transistor 24 coupled to ground. The cross-coupling of the inverters provide feedback such that the memory cell 10 can maintain a binary value of "0" or "1." The memory cell 10 is read or written by asserting the word line 26 such that the pass gate 12 and pass gate 14 conduct. During a write, the value to be stored in the memory cell 10 is placed on the bit-line true (BLT) signal 30 (may also be referred to as a BLT line) and an inverted value to be stored in the memory cell 10 is placed on the bit-line complement (BLC) signal 28 (may also be referred to as a BLC line). During a read, the memory cell 10 places the value in the cell on the BLT signal 30 and an inverted value on the BLC signal 28.

Figure 2:
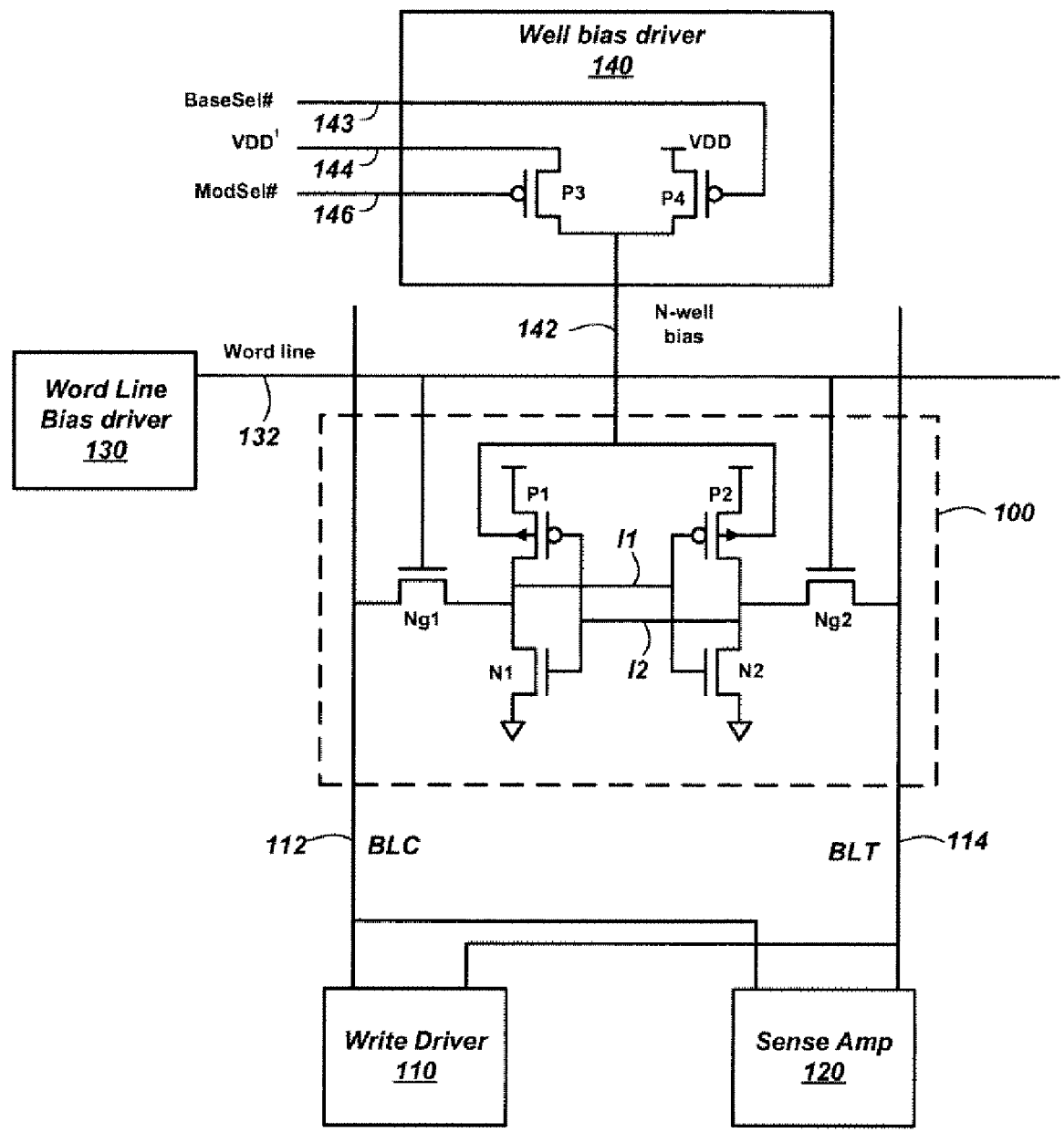
FIG. 2 is a schematic diagram of a memory cell according to one or more embodiments of the present invention.

FIG. 2 illustrates a memory cell 100 according to an embodiment of the present invention, as well as some peripheral circuitry for controlling the memory cell 100. The peripheral circuitry includes a write driver 110, a sense amplifier 120, a word line bias driver 130, and a well bias driver 140. The memory cell 100 includes a pair of cross-coupled inverters. The first inverter includes a p-channel transistor P1 with its source coupled to a high supply voltage (e.g., VDD) and an n-channel transistor N1 with its source coupled to ground. The second inverter includes a p-channel transistor P2 with its source coupled to VDD and an n-channel transistor N2 with its source coupled to a low supply voltage (e.g., VSS or ground). As stated, the cross-coupling of the inverters provides feedback such that the memory cell 100 can maintain a binary value of "0" or "1." The memory cell 100 is written or read by asserting the word line 132 such that pass gate Ng1 and pass gate Ng2 conduct. The p-channel transistors P1 and P2 each include a bulk node coupled to an N-well bias signal 142 driven by the well bias driver 140. The p-channel transistors P1 and P2 may be in a common N-well with a common connection to the N-well bias signal 142. Alternatively, the p-channel transistors P1 and P2 each may be in their own N-well wherein the N-well bias signal 142 connects to each well. The well bias driver 140 and word line bias driver 130 will be explained further below.

As stated earlier, design of a memory cell 100 requires a trade-off between optimizing the memory cell 100 for different operational modes. For example, a memory cell 100 may be optimized one way for operation during a read access, but optimized a different way for a write access. When discussing optimization it is useful to discuss the relative drive strengths of the transistors of the memory cell 100. Thus, transistors may be referred to as relatively strong or relatively weak. In addition, when discussing the importance of transistor drive strengths (which is correlated to transistor sizes) it is useful to discuss the ratios of transistors making up the cross-coupled inverters relative to the pass gates Ng1 and Ng2. As a result, the relative strength of the p-channel transistors P1 and P2 may be referred to as Tpu (transistor pull-up), the relative strength of the n-channel transistors N1 and N2 may be referred to as Tpd (transistor pull-down), and the relative strength of the pass gates Ng1 and Ng2 may be referred to as Tpg (transistor pass gate). A ratio for the p-channel transistors P1 and P2 may be referred to as Rpu, which is the ratio of Tpu/Tpg. In other words, a larger Rpu indicates that the p-channel transistors P1 and P2 have a large drive strength relative to the pass gates Ng1 and Ng2 and a smaller Rpu indicates that the p-channel transistors P1 and P2 have a small drive strength relative to the pass gates Ng1 and Ng2. Similarly, the ratio for the n-channel transistors N1 and N2 may be referred to as Rpd, which is the ratio of Tpd/Tpg.

In write operations, the write driver 110 places the data value to be written into the memory cell 100 on the BLT signal 114 and a complement of the data value to be written on the BLC signal 112. For example, to write a "1" the write driver 110 places a "1" (e.g., a high voltage) on the BLT signal 114 and a "0" (e.g., a low voltage) on the BLC signal 112. The word line signal 132 is asserted to write the data into the memory cell 100. As an example, assume the memory cell 100 holds a "0" before the write. In other words, the first inverter output I1 is high and the second inverter output I2 is low. When the pass gates Ng1 and Ng2 are enabled by the asserted word line signal 132, the "1" on the BLT signal 114 overdrives the "0" on the second inverter output I2 until the voltage of I2 is above a threshold voltage of n-channel transistor N1. At that point, N1 begins to conduct, to start pulling the first inverter output I1 toward a low. In addition, the first inverter output is also being driven to a low through pass gate Ng1. As the first inverter output I1 begins to go low, p-channel transistor P2 begins to turn on and the memory cell 100 "flips" to a stable value of a "1" (i.e., a high on I2 and a low on I1). This ability to properly write a value to the memory cell 100 is referred to herein as "write stability."

To optimize this writing process, it would be advantageous to have strong pass gates Ng1 and Ng2 relative to the transistors in the inverters (P1, P2, N1, and N2) to enable the pass gates to easily overdrive the inverter outputs I1 and I2. In other words, for an optimized write, Rpu and Rpd should be relatively small. However, these relative strengths are in conflict with an optimized read operation.

In read operations, the sense amplifier 120 pre-charges a starting value onto both the BLT signal 114 and the BLC signal 112. As non-limiting examples, the BLT and BLC signals 114 and 112 may be pre-charged to VDD or VDD/2, depending on the design of the memory. For this discussion, assume the BLT and BLC signals 114 and 112 are pre-charged to VDD/2. The word line signal 132 is then asserted to enable the pass gates Ng1 and Ng2. With the pass gates Ng1 and Ng2 on, the memory cell 100 will begin to drive its stored value onto the BLT and BLC signals 114 and 112. For example, to read a "1" from the memory cell 100, the memory cell 100 begins to drive the high voltage stored on the second inverter output I2 onto the BLT signal 114 and drive the low voltage stored on the first inverter output I1 onto the BLC signal 112. The sense amplifier 120 is very sensitive to differential changes between the BLT signal 114 and the BLC signal 112. When the sense amplifier 120 senses the BLT signal 114 beginning to go high and the BLC signal 112 beginning to go low, it will amplify this difference with strong drivers to force the BLT signal 114 high and the BLT signal 114 low.

In a full memory array there are many memory cells 100 coupled in parallel causing a large capacitive load on the JILT signal 114 and the BLC signal 112. The cross-coupled inverters are not strong enough to drive this large capacitive load. Thus, the sense amplifier 120 completes the drive based on sensing a small difference between the BLT signal 114 and the BLC signal 112 generated by the memory cell 100. In addition, since the cross-coupled inverters are relatively weak, the voltage on the inverter outputs I1 and I2 may move away from the supply voltages when charging the BLT signal 114 and BLC signal 112. For example, the BLT signal 114 was pre-charged to VDD/2 and the second inverter output I2 attempts to charge the BLT signal 114 toward VDD through p-channel transistor P2 and pass gate Ng2. As a result, the second inverter output I2 will begin to dip away from VDD. If the second inverter output I2 dips far enough, the first inverter may sense a low on the second inverter output I2 and the memory cell 100 will erroneously "flip" from the "1" state to the "0" state during the read.

Consequently, to optimize for a read operation, it would be advantageous to have weak pass gates Ng1 and Ng2 relative to the transistors in the inverters (P1, P2, N1, and N2) to enable the transistors in the inverters (P1, P2, N1, and N2) to maintain the state while still charging or discharging the BLT signal 114 and BLC signal 112 by an adequate amount for the sense amplifier 120 to detect. In other words, for an optimized read, Rpu and Rpd should be relatively large. This ability to properly read a value of the memory cell 1 without "upsetting" the value in the memory cell 100 is referred to herein as "read stability."

Designing for read stability and write stability at the same time is a balance because read stability wants large values for Rpu and RN, while write stability wants small values for Rpu and Rpd.

Figure 3:
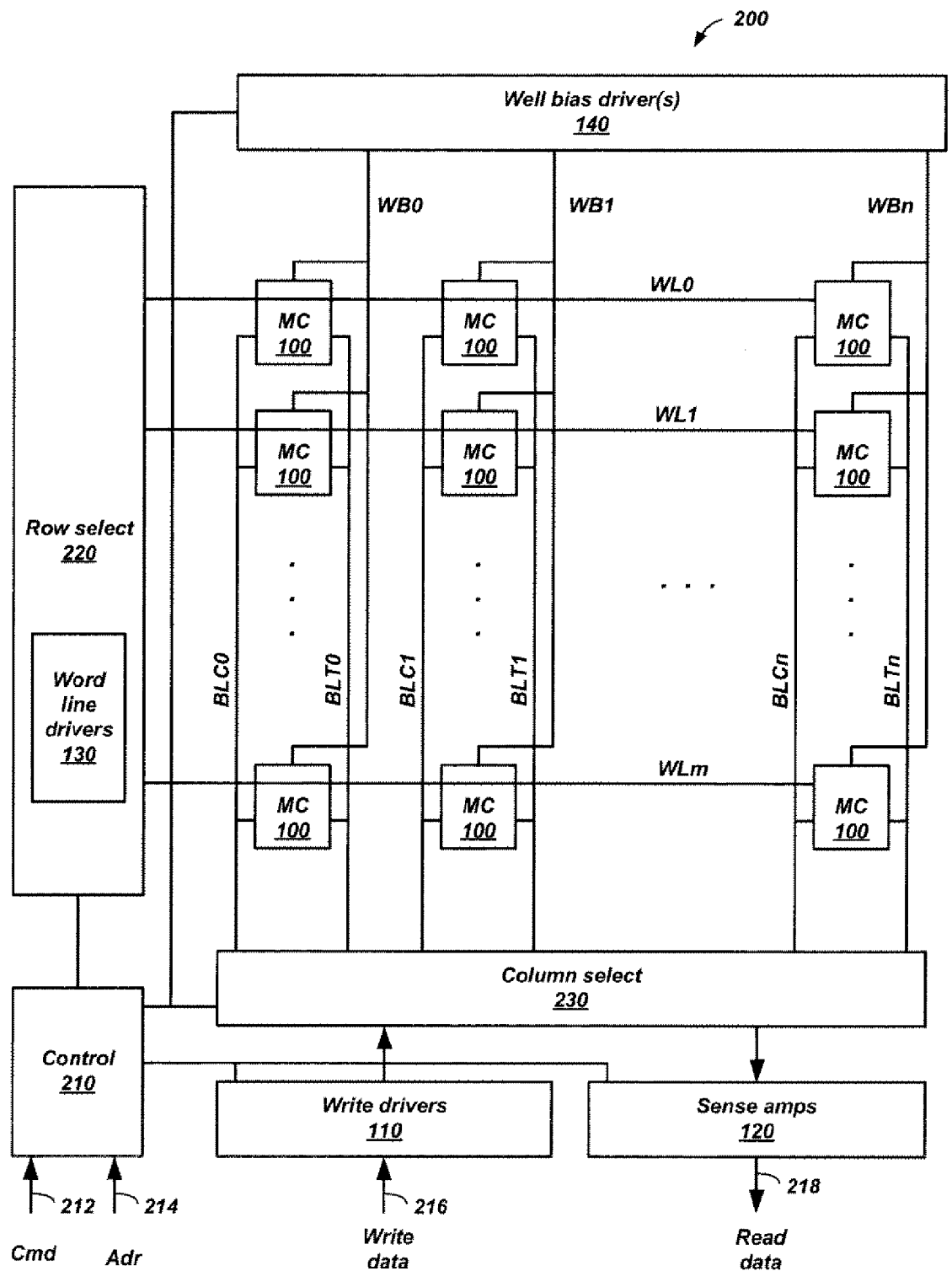
FIG. 3 is a simplified block diagram of an SRAM memory.

FIG. 3 is a simplified block diagram of a complete SRAM memory 200 including multiple memory cells 100. Command signals 212 and address signals 214 drive a control block 210. The control block drives row select logic 220, column select logic 230, write drivers 110, sense amplifiers 120, well bias drivers 140 and word line bias drivers 130. The memory cells 100 are arranged in rows (0-*m*) and columns (0-*n*).

Some memories may not use column select logic and may be designed such that a given data word (e.g., 8-bits, 16, bits, etc.) is addressed only by the rows. In other words, in a simplified example, a memory array of 1024 rows and 8 columns would address 1024 8-bit words with each word on a different row and selected by the word lines (WL0, WL1, through WLm). Other memories may use multiple columns as part of the addressing. In other words, in a simplified example, a memory array of 256 rows and 32 columns would still address 1024 8-bit words, but eight of the address bits are used to select a row and two of the address bits go to the column select to select one of four columns for each bit. Thus, a single bit within a word includes four different columns that are multiplexed to select one of the four based on the two bit column address. Those of ordinary skill in the art will recognize that many organizations are possible and contemplated for embodiments of the present invention.

For write operations, the write drivers 110 use the write data 216 to drive the appropriate bit lines (BLT0, BLT1, through BLTn) ad complement bit lines (BLC0, BLC1, through BLCn) through the column select logic 230, if present. Similarly, the sense amplifiers 120 sense the appropriate bit lines and complement bit lines trough the column select logic 230, if preset and drive the resulting read data 218.

The well bias drivers generate well bias signals (WB0, WB1, through WBn) to connect to each of the memory cells 100. The well bias signals WB0-WBn may all be driven from a single driver. Alternatively, the well bias signals may have separate drivers for each column or group of columns. As a non-limiting example, if the column address includes two bits, there may be four well bias drivers such that each well bias driver is coupled to the columns associated with a specific column address.

Returning to the read stabilitlly and write stability issue, and in reference to FIGS. 2 and 3, well bias drivers 140 might be included so characteristics of the memory cell 100 may be modified after fabrication of the SRAM memory 200. Recall that for good read stability the memory cell 100 should be designed with large values for Rpu and Rpd, and for good write stability the memory cell 100 should be designed with small values for Rpu and Rpd.

However, as feature sizes, and possible gate lengths, shrink to 65 nanometers and below, process variations, e.g., oxide thickness, ion implantation, channel length/lithography, doping fluctuations, Negative Bias Temperature Instability (NBTI), defects, gate oxide defects, operating temperature variations, operating voltage variation, and other phenomena including terrestrial and extraterrestrial radiation manifest as changes to transistor threshold voltage VT such at it makes the design of a memory cell 100 that is stable for both reads and writes very difficult.

However, the process variations may be considered to be local parameter variations (i.e., the amount a parameter may vary within the same semiconductor die) and global parameter variations (i.e., the amount a parameter may vary from die-to-die on the same wafer or wafer-to-wafer). In addition, device operation may degrade over time. For example, NBTI manifests as a decrease in drive strength and increase in threshold voltage over time. Thus, memory cell designers must account for local variations, global variations, and temporal variations.

As stated earlier, to design stable memory cells 100 across this combination of broad variations, designers have used gate lengths longer than the minimum allowed by lithography to limit the resulting VT variations.

Embodiments of the present invention might enable a designer to design a smaller memory cell with smaller gate lengths by allowing the designer to use the more limited local variations. The potential global and temporal variations may be compensated for after processing and testing the device.

As a non-limiting example, channel length variations including global, local, and temporal variations may be as large as +−90% for a target channel length of 45 nanometers. However, if only local variations are considered, the variations may be closer to +−30% for a target channel length of 45 nanometers. As another non-limiting example, combined variations for doping concentrations may be about +−50%, whereas only local variations may be closer to +−7%.

Thus, if a memory cell 100 is designed considering local variations, a design with small gate lengths (as allowed by design rules for a given technology size) can be properly balanced between read stability and write stability such that the memory cell 100 is functional across all local variations. However, after fabrication, global and temporal variations that were not accounted for during the design, may be large enough that the memory cell 100 is no longer stable for read operations or write operations. In these cases, the well bias for the p-channel transistors P1 and P2 may be modified (also referred to herein as adjusted) to modify the VT and drive strength of the p-channel transistors P1 and P2 in a manner that may bring the memory cells 100 back to a point where they are stable for both read operations and write operations.

If, during testing, memory cells 100 are determined to be unstable for write operations, an increased bias can be applied to the N-wells to decrease the drive strength of the p-channel transistors P1 and P2 and as a result create a lower Rpu ratio that will enhance write stability. On the other hand, it during testing, memory cells 100 are determined to be unstable for read operations, a decreased bias can be applied to the N-wells to increase the drive strength of the p-channel transistors P1 and P2 and as a result create a higher Rpu ratio that will enhance read stability.

Thus, to create stable memory cells 110, first the memory cells 100 are designed to be stable for both reads and writes using local variations. Next, during processing, the implantation dose for the memory cell 100 devices may be adjusted to result in high threshold n-channel transistors (N1, N2, Ng1, and Ng2) and |low threshold| p-channel transistors P1 and P2 that correspond to the design parameters for the local variations. Finally, during chip testing, the N-well bias may be adjusted, if needed, to modify the drive strengths of the p-channel transistors P1 and P2 either higher or lower to create both read stability and write stability.

In the embodiments described so far, the threshold voltage of the p-channel transistors P1 and P2 may be changed by modifying the N-well bias. Those of ordinary skill in the art will recognize that embodiments of the present invention may include n-channel transistors N1 and N2 in a P-well, wherein the P-well may be biased to modify the threshold voltage, the drive strength, or combinations thereof for the n-channel transistors N1 and N2.

Figure 4:
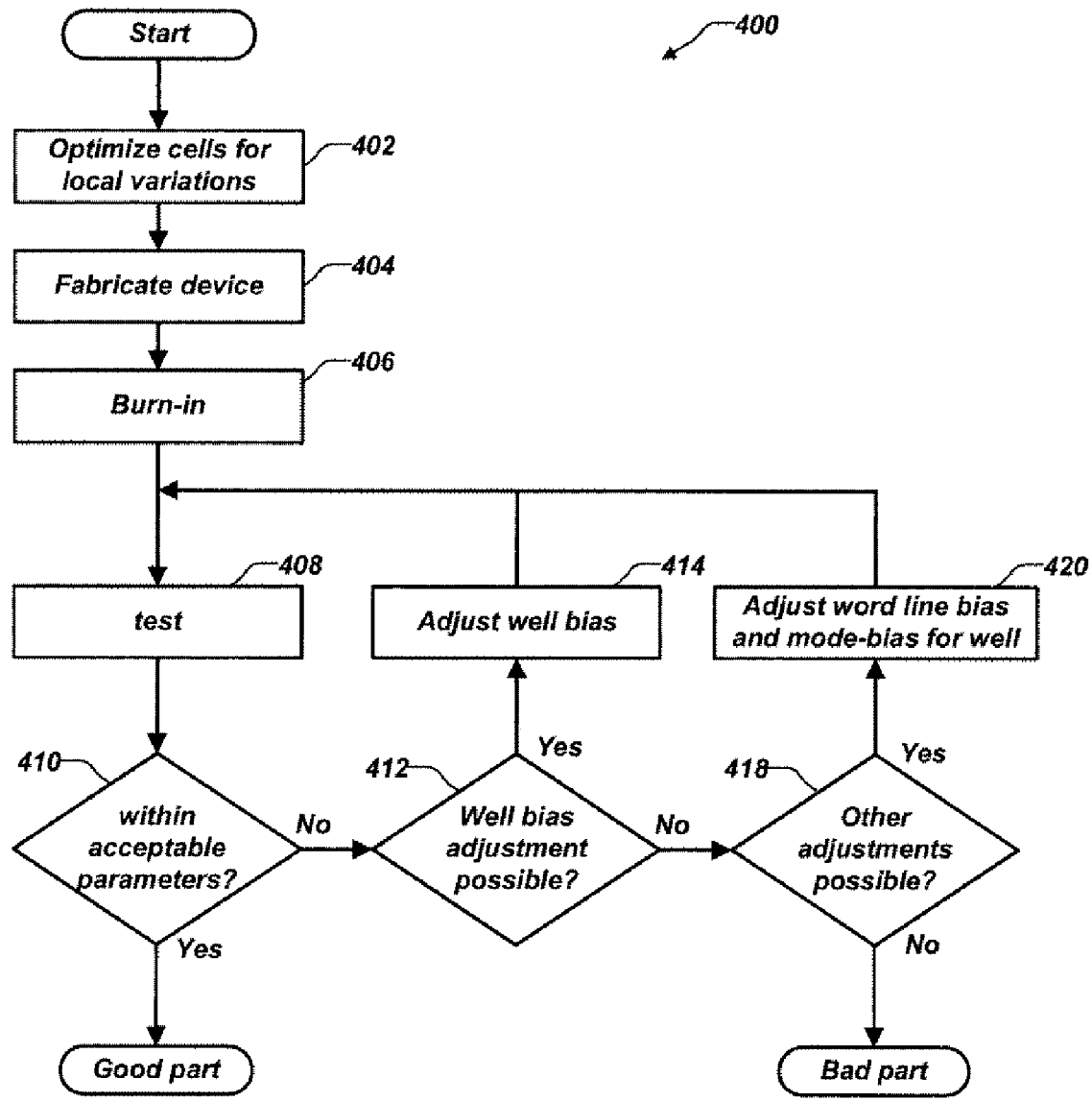
FIG. 4 is a simplified flow diagram illustrating a process for designing, testing, and modifying operational parameters of a memory.

FIG. 4 is a simplified flow diagram illustrating a process 400 for designing, testing, and modifying operational parameters of a memory. Operation block 402 indicates that the memory cells 100 are optimized for balanced read and write stabilities using local parameter variations. Operation block 404 indicates that the device is fabricated. Operation block 406 indicates that an optional burn-in process may be performed. The burn-in process may compensate for some of the temporal drift in operation parameters that may occur over the lifetime of the SRAM memory 200. Operation block 408 indicates that the SRAM memory 200 is tested to see if it includes acceptable margins for both read and write stability over temperature and supply voltage variations. This testing is done with the default N-well biasing wherein the N-well is connected to VDD. As a non-limiting example, an acceptable margin for read and write stability may be that all cells can be accurately read and written multiple times with no errors across the rated temperature and voltage ranges.

Decision block 410 indicates that if the SRAM memory 200 has acceptable margins, the part may be considered good and no bias adjustment of the n-well is needed. If, however, the read stability or the write stability is not within acceptable margins, decision block 412 determines whether a well bias adjustment is possible. If so, operation block 414 indicates that the well bias is adjusted (as will be explained more fully below) and the test process of operation block 408 is performed again. A change in the well bias may be performed by adding or subtracting a bias offset to the original bias in increments with multiple iterations through the testing and bias adjusting loop until acceptable read stability and write stability margins are obtained.

Thus, as a non-limiting example, if a VT of −0.2 volts was desired, based on local variations, and the manufactured part is not stable for both read and write operations, then the VT may have shifted due to global variations or temporal variations. In these cases, the well bias may be adjusted in order to try to bring the VT of the p-channel transistors P1 and P2 back to the desired −0.2 volts. This new N-well bias may be referred to herein as VDD' and will become the new bias for all the N-wells of the memory devices 100. Thus, in these well bias adjustments, the well bias remains substantially constant at the new bias value for both read operations and write operations.

When the limit of how much the well bias can be adjusted has been reached, decision block 418 determines whether other adjustments are possible to try to obtain acceptable margins for both read stability and write stability. If other adjustments are possible, operation block 420 makes those adjustments, and the test process of operation block 408 is performed again. If no other adjustments are possible, the part may be considered inoperable.

However, many times parts may be graded for different applications wherein parts may have relaxed requirements for temperature and operating voltage. As a result, if the part is considered bad at one grade, process 400 may be repeated at different temperatures and operating voltages to see if acceptable margins for read stability and write stability can be achieved at the relaxed grade.

The additional adjustments in process block 420 include adjusting a word line bias and implementing an operational mode bias. The operational mode bias includes further modifications to the N-well bias VDD' based on whether a read operation is being performed or a write operation is being performed. Thus, during read operations, the N-well bias may be driven lower than VDD' to increase the drive strength of the p-channel transistors P1 and P2 and increase read stability. During write operations, the N-well bias may be driven higher than VDD' to decrease the drive strength of the p-channel transistors P1 and P2 and increase write stability. Thus, VDD' may be decreased, increased, left the same, or combinations thereof based on whether a read is being performed or a write is being performed.

Modifying the N-well bias dynamically based on reads versus writes may require significant power. Since the N-wells have significant capacitance, the $C*(V**2)*f$ power requirements can be large. As a result, some embodiments may include separate well bias drivers based on column address as was described earlier. In this way, only the columns being addressed would need the mode-bias adjustment of VDD'.

The word line voltage may also be modified from normal operation in an effort to increase write stability. As a non-limiting example, and referring to FIG. 2, the word line bias driver 130 may boost the word line to 0.5 volts above VDD during writes to strengthen the drive of the pass gates Ng1 and Ng2. As a result, this boosted voltage decreases the ratios Rpu and Rpd, which increases write stability. This boosted voltage may be achieved by any conventional voltage generation or voltage boosting circuit.

Figure 5:
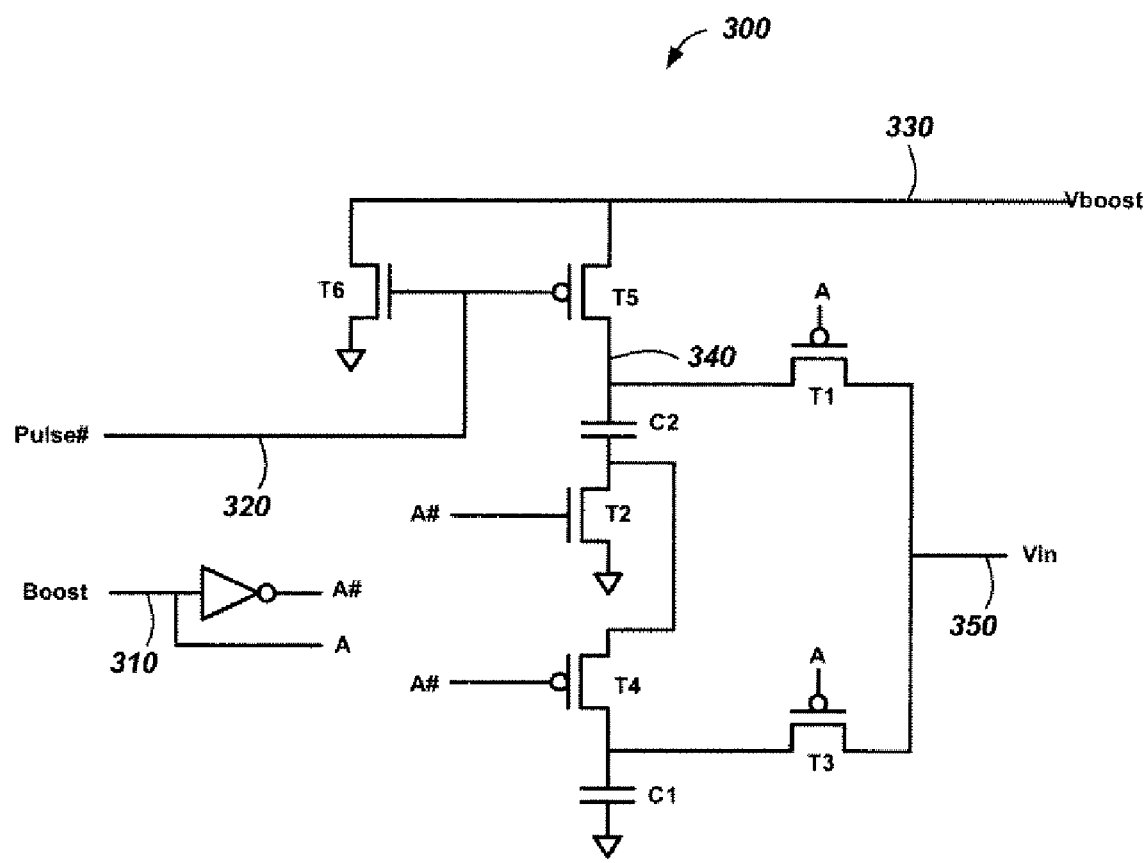
FIG. 5 is a schematic diagram of a voltage booster.

FIG. 5 is a schematic diagram of one possible voltage booster 300. The voltage booster 300 includes four p-channel transistors (T1, T3, T4, and T5), two n-channel transistors (T2 and T6), and two capacitors (C1 and C2). The p-channel transistors T1 and T3 have their sources coupled to Vin 350, which may be VDD or some other voltage source value. The BOOST signal 310 determines the gate input A for transistors T1 and T3, and the gate input A# for transistors T2 and T4.

When the Pulse# signal 320 is high T6 is on and T5 is off, effectively grounding the Vboost signal 330. Conversely, when the Pulse# signal 320 is low, T6 is off and T5 is on and the Vboost signal 330 is determined by node 340, which is controlled by the BOOST signal 310. When the BOOST signal 310 is low, transistors T1, T2, T3 are on while T4 is off. Thus, capacitors C1 and C2 are fully charged to the value of Vin 350. For discussion purposes, assume Vin 350 is VDD). Thus, when the BOOST signal 310 is low node 340 and the Vboost signal 330 rise to VDD. When the BOOST signal 310 is high, transistors T1, T2, T3 are off while T4 is on. As a result, capacitors C1 and C2 are in series and boost the voltage on node 340 and the Vboost signal 330 to a voltage VDDB above VDD. If a steady VDDB is desired, the BOOST signal 310 may be controlled by a high frequency oscillating signal, such as, for example, a system clock.

Returning to FIG. 2, this voltage booster 300 may be used for the word line bias driver 130 or the well bias driver 140. FIG. 2 illustrates one embodiment for creating the n-well bias signal 142. In FIG. 2 the well bias driver includes a simple multiplexer for enabling VDD onto the N-well bias signal 142 when BaseSel# 143 is asserted or enabling VDD' 144 onto the N-well bias signal 142 when ModSel# 146 is asserted. Thus, if during testing it is determined that a VDD' is desired, ModSel# 146 may be asserted and BaseSel# 143 may be negated. These values may be stored in a non-volatile element that can be programmed during testing, such as, for example, a Flash cell, a fuse, or an anti-fuse. The actual value of VDD' 144 may be further modified based on testing, or mode-biasing, as was explained previously. This further modification may be performed by the voltage booster 30 of FIG. 5, another conventional voltage booster or a conventional voltage reducer, such as, for example, a diode drop, a resistor divider, a band-gap reference, and the like.

VDD' may be modified within a voltage range based on conventional diode characteristics. For example, VDD' may be boosted above VDD to the limit of a diode breakdown voltage and may be reduced below VDD to the limit of a diode drop below VDD. Of course, the VDD boosting and reducing may be performed directly from a boost/reduce circuit rather than the multiplexer illustrated in the well bias driver 140.

Figure 6:
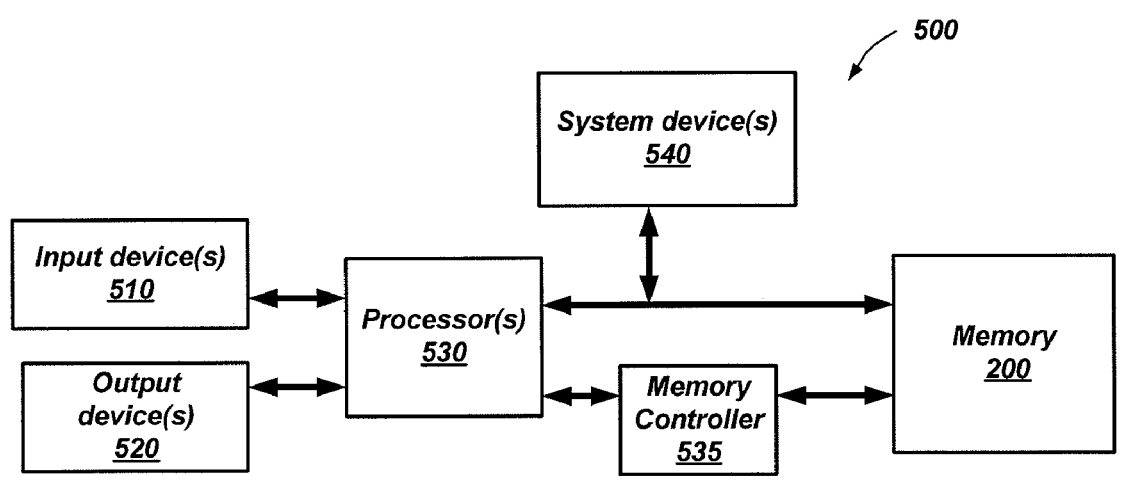
FIG. 6 is a simplified system block diagram of a system including one or more embodiments of the present invention.

FIG. 6 is a simplified system block diagram of a system including one or more embodiments of the present invention. As shown in FIG. 6, an electronic system 500, may include at least one input device 510, at least one output device 520, at least one processor 530, and at least one SRAM memory 200 incorporating an embodiment of the modifiable memory cells 100 described herein.

The electronic system 500 may also include a memory controller 535, as well as other system devices 540, such as, for example, interrupt controllers, direct memory access devices, graphics controllers, and the like. The electronic system may be embodied as a system on a chip incorporating two or more of the elements in the electronic system 500.

CONCLUSION

Embodiments of the present invention can include systems, devices including SRAM memory cells, and memory cells, as well as methods for operating and methods for testing SRAM memory cells. An SRAM includes a plurality of memory cells wherein a read stability and a write stability of each memory cell can be modified by adjusting (i.e., modifying) a well bias signal operably coupled to an N-well containing at least one p-channel transistor for each memory cell. One or more well bias drivers generate the well bias signal at VDD or at a bias offset from VDD for both read operations and write operations.

The memory cells of one or more embodiments each include a first inverter and a second inverter. Each inverter includes an n-channel transistor and a p-channel transistor. The p-channel transistors include a source node coupled to a source voltage and a bulk node coupled to a well bias voltage. The memory cells also include a first pass gate connected to an input of the first inverter and a second pass gate connected to an input of the second inverter. The memory cell's stability may be modified by adjusting the well bias voltage to a substantially constant bias offset relative to the source voltage for both read operations and write operations.

The memory cells may be operated by determining whether they operate correctly within selected parameters when the N-wells are biased at VDD. With the determination made, the memory cells are operated with the N-well biased at VDD if they operate correctly within the selected parameters when biased at VDD. Alternatively, the memory cells are operated with the N-well biased at a bias offset from VDD).

The memory cells may be adjusted for operation by designing the memory device to be stable relative to local parameter variations with a well bias substantially equal to VDD. The memory cells are then tested for stable read operations and stable write operations. If the write operations are unstable, the well bias is increased. If the read operations are unstable, the well bias is decreased.

Although the present invention has been described with reference to particular embodiments, the present invention is not limited to these described embodiments. Rather, the present invention is limited only by the appended claims, which include within their scope all equivalent devices or methods that operate according to the principles of the present invention as described.

What is claimed is:

1. A memory cell circuit, comprising:
  a pair of cross-coupled inverters including a pair of p-channel transistors and a pair of n-channel transistors, wherein the pair of p-channel transistors or the pair of n-channel transistors are formed in a well coupled to a well bias voltage;
  a first pass gate operably coupled to an input of a first inverter of the pair of cross-coupled inverters; and
  a second pass gate operably coupled to an input of a second inverter of the pair of cross-coupled inverters;
  wherein a stability of the memory cell is modifiable by adjusting the well bias voltage to:
    a supply voltage when the stability is within a predetermined range after testing; and
    a first bias offset from the supply voltage when the stability is outside the predetermined range after testing.

2. The memory cell circuit of claim 1, further comprising a well bias driver configured for supplying the well bias voltage at substantially equal to the supply voltage or an adjusted well bias voltage at the first bias offset from the well bias voltage.

3. The memory cell circuit of claim 2, wherein the well bias driver is configured to further adjust the adjusted well bias voltage to a second bias offset relative to the supply voltage.

4. The memory cell circuit of claim 2, wherein the well bias driver is configured to select the adjusted well bias voltage for a read operations and select the adjusted well bias voltage with a second bias offset during a write operations.

5. The memory cell circuit of claim 1, further comprising a line bias driver for generating a line signal operably coupled to a gate of the first pass gate and a gate of the second pass gate, wherein the line bias driver supplies a first voltage to enable the first pass gate and the second pass gate during a read operations and the line bias driver supplies a second voltage higher than the first voltage during a write operations.

6. The memory cell circuit of claim 1, wherein the first bias offset is positive to increase write stability and negative to increase read stability.

7. The memory cell circuit of claim 1, wherein the well is an N-well containing the pair of p-channel transistors or the well is a P-well containing the pair of n-channel transistors.

8. A static random access memory (SRAM), comprising:
  a plurality of memory cells wherein a stability of each memory cell is modifiable by adjusting a well bias signal operably coupled to a well containing at least one transistor for each memory cell; and at least one well bias driver for generating the well bias signal at:
a supply voltage when the stability is within a predetermined range after testing; and
a bias offset from the supply voltage when the stability is outside the predetermined range after testing.

9. The SRAM of claim 8, further comprising a plurality of line bias drivers for generating a plurality of line signals, each line signal operably coupled to all the plurality of memory cells in a row of a memory array comprising the plurality of memory cells, wherein:
each line bias driver enables the memory cells in the row attached thereto for reading during the read operations by driving a first voltage; and
each line bias driver enables the memory cells in the row attached thereto for writing by driving a second voltage higher than the first voltage during the write operations.

10. The SRAM of claim 8, wherein the at least one well bias driver comprises a plurality of well bias drivers, wherein each of the plurality of well bias drivers is configured to drive the well bias signal for all the plurality of memory cells in a column of a memory array comprising the plurality of memory cells.

11. A static random access memory (SRAM), comprising:
a plurality of memory cells wherein a read stability and a write stability of each memory cell is modifiable by adjusting a well bias signal operably coupled to a well containing at least one transistor for each memory cell; and
at least one well bias driver for generating the well bias signal at:
for read operations, one of a supply voltage, a bias offset from the supply voltage, and a second bias offset from the supply voltage; and
for write operations, one of the supply voltage, the bias offset from the supply voltage, and the second bias offset from the supply voltage.

12. The SRAM of claim 11, further comprising a plurality of line bias drivers for generating a plurality of line signals, each line signal operably coupled to all the plurality of memory cells in a row of a memory array comprising the plurality of memory cells, wherein each line bias driver is configured to:
enable the memory cells in the row attached thereto for reading by driving a first voltage on a corresponding line signal; and
enable the memory cells in the row attached thereto for writing by driving a second voltage higher than the first voltage on a corresponding line signal.

13. The SRAM of claim 11, wherein the at least one well bias driver comprises a plurality of well bias drivers operably coupled to all the plurality of memory cells in a column of a memory array comprising the plurality of memory cells.

14. A computing system, comprising:
at least one processor; and
at least one static random access memory (SRAM), comprising:
a plurality of memory cells wherein a stability of each memory cell is modifiable by adjusting a well bias signal operably coupled to a well containing at least one transistor for each memory cell; and
at least one well bias driver for generating the well bias signal;
wherein the well bias signal is adjustable to:
a supply voltage when the stability is tested to be within a predetermined range; and
a bias offset from the supply voltage when the stability is tested to be outside the predetermined range.

15. The computing system of claim 14, wherein the at least one well bias driver generates the well bias signal higher than the supply voltage to increase write stability and lower than the supply voltage to increase read stability.

16. A method of operating a memory device, comprising:
operating a plurality of memory cells that each include at least one transistor in a well configured to be biased at a supply voltage or a bias offset from the supply voltage;
determining whether the plurality of memory cells on the memory device operate correctly within predetermined parameters when biased at the supply voltage;
operating the memory device with the well biased at the supply voltage if the memory device operates correctly within the predetermined parameters when biased at the supply voltage; and
operating the memory device with the at least one N-well biased at the bias offset from the supply voltage if the memory device does not operate correctly within the predetermined parameters when biased at the supply voltage.

17. The method of claim 16, wherein operating the memory device with the well biased at the bias offset from the supply voltage comprises operating with a positive bias offset relative to the supply voltage to enhance write stability or operating with a negative bias offset relative to the supply voltage to enhance read stability.

18. The method of claim 16, wherein operating the memory device with the well biased at the bias offset from the supply voltage and operating the memory device with the well biased at the bias offset from the supply voltage comprise:
during read operations, selecting at least some of the plurality of memory cells with a line signal at a first voltage high enough to enable a pass gate on the selected memory cells; and
during write operations, selecting at least some of the plurality of memory cells with the line signal at a second voltage higher than the first voltage.

19. The method of claim 16, further comprising boosting the well bias for write operations, decreasing the well bias for read operations.

20. A method of adjusting a memory device, comprising:
testing the memory device for stable read operations and stable write operations; and
modifying a well bias to an adjusted well bias by:
increasing the well bias to memory cells on the memory device if the memory device is not stable for the write operations; and
decreasing the well bias to memory cells on the memory device if the memory device is not stable for the read operations.

21. The method of claim 20, further comprising performing a burn-in of the memory device prior to the act of testing the memory device.

22. The method of claim 20, further comprising:
testing the memory device for stable read operations and stable write operations with the adjusted well bias; and
reducing the adjusted well bias during the read operations to enhance read stability of the memory device.

23. The method of claim 20, further comprising:
testing the memory device for stable read operations and stable write operations with the adjusted well bias; and
boosting the adjusted well bias during the write.

24. The method of claim 20, further comprising:
testing the memory device for stable read operations and stable write operations with the adjusted well bias; and boosting a voltage of a line signal during the write operations to enhance write stability of the memory device if the memory device is not stable for the write operations.

25. The method of claim 24, further comprising:
testing the memory device for stable read operations and stable write operations with the adjusted well bias and the boosted line signal during the write operations; and
reducing the adjusted well bias during the read operations.

26. The method of claim 24, further comprising:
testing the memory device for stable read operations and stable write operations with the adjusted well bias and the boosted word-line voltage during write operations; and
boosting the adjusted well bias during the write operations to enhance write stability of the memory device.

* * * * *

UNITED STATES PATENT AND TRADEMARK OFFICE
CERTIFICATE OF CORRECTION

PATENT NO. : 7,613,031 B2 Page 1 of 1
APPLICATION NO. : 11/856624
DATED : November 3, 2009
INVENTOR(S) : Hussein I. Hanafi et al.

It is certified that error appears in the above-identified patent and that said Letters Patent is hereby corrected as shown below:

In column 12, line 18, in Claim 16, delete "the at least one N-well" and insert -- the well --, therefor.

In column 12, line 64, in Claim 23, delete "write." and insert -- write operations. --, therefor.

Signed and Sealed this

Fifth Day of January, 2010

David J. Kappos
*Director of the United States Patent and Trademark Office*